United States Patent
Cheng et al.

(10) Patent No.: US 8,362,515 B2
(45) Date of Patent: Jan. 29, 2013

(54) CHIP PACKAGE AND METHOD FOR FORMING THE SAME

(76) Inventors: Chia-Ming Cheng, Xinzhuang (TW); Chien-Hung Liu, Xindian (TW)

( * ) Notice: Subject to any disclaimer, the term of this patent is extended or adjusted under 35 U.S.C. 154(b) by 37 days.

(21) Appl. No.: 13/081,346

(22) Filed: Apr. 6, 2011

(65) Prior Publication Data

US 2011/0248310 A1    Oct. 13, 2011

Related U.S. Application Data

(60) Provisional application No. 61/321,759, filed on Apr. 7, 2010.

(51) Int. Cl.
   *H01L 33/00* (2010.01)
(52) U.S. Cl. .............. 257/99; 257/E29.255; 257/288; 257/774; 438/22
(58) Field of Classification Search ........... 257/E21.599, 257/E29.255, E33.066, 80, 99, 288, 620, 257/621, 678, 692, 698, 706, 773, 774, 787; 438/110, 113, 122; 361/714
   See application file for complete search history.

(56) References Cited

U.S. PATENT DOCUMENTS

| | | | | |
|---|---|---|---|---|
| 5,140,745 | A * | 8/1992 | McKenzie, Jr. | 29/852 |
| 5,600,101 | A * | 2/1997 | Sakai | 174/261 |
| 7,026,654 | B2 * | 4/2006 | Igaki et al. | 257/80 |
| 7,750,441 | B2 * | 7/2010 | Hsu et al. | 257/621 |
| 7,807,504 | B2 * | 10/2010 | Otremba et al. | 438/110 |
| 7,863,730 | B2 * | 1/2011 | Shim et al. | 257/706 |
| 7,911,043 | B2 * | 3/2011 | Hong et al. | 257/678 |
| 7,993,976 | B2 * | 8/2011 | Do et al. | 438/113 |
| 2002/0053742 | A1 * | 5/2002 | Hata et al. | 257/774 |
| 2004/0124523 | A1 * | 7/2004 | Poo et al. | 257/698 |
| 2004/0207049 | A1 * | 10/2004 | Bauer et al. | 257/620 |
| 2006/0208350 | A1 * | 9/2006 | Poo et al. | 257/692 |
| 2010/0252852 | A1 * | 10/2010 | Wei et al. | 257/99 |
| 2011/0108896 | A1 * | 5/2011 | Feng et al. | 257/288 |

FOREIGN PATENT DOCUMENTS

| | | |
|---|---|---|
| CN | 1453847 | 11/2003 |
| CN | 1871710 | 11/2006 |

* cited by examiner

*Primary Examiner* — Chris Chu
(74) *Attorney, Agent, or Firm* — Liu & Liu

(57) ABSTRACT

An embodiment of the invention provides a chip package which includes a substrate having an upper surface and a lower surface and having at least a side surface, and at least a trench extending from the upper surface towards the lower surface and extending from the side surface towards an inner portion of the substrate, wherein a width of the trench near the upper surface is not equal to a width of the trench near the lower surface, and at least an insulating layer located on a sidewall of the trench, and at least a conducting pattern located on the insulating layer, wherein the side surface is separated from the conducting pattern in the trench by a predetermined distance such that a portion of the insulating layer is exposed, and at least a conducting region electrically connected to the conducting pattern.

10 Claims, 14 Drawing Sheets

CHIP PACKAGE AND METHOD FOR FORMING THE SAME

CROSS REFERENCE

This Application claims the benefit of U.S. Provisional Application No. 61/321,759, filed on Apr. 7, 2010, the entirety of which is incorporated by reference herein.

BACKGROUND OF THE INVENTION

1. Field of the Invention

The present invention relates to a chip package and fabrication method thereof, and in particular relates to a chip package formed by a wafer-level packaging process.

2. Description of the Related Art

The chip packaging process is an important process when fabrication an electronic product. Chip packages not only provide chips with protection from environmental contaminants, but also provide an interface for connections between electronic elements in the chips and electronic elements outside of the chip package.

Forming a reliable chip package with low cost is an important issue.

BRIEF SUMMARY OF THE INVENTION

An embodiment of the present invention provides a chip package including: a substrate having an upper surface and a lower surface and having at least a side surface; at least a trench extending from the upper surface towards the lower surface and extending from the side surface towards an inner portion of the substrate, wherein a width of the trench near the upper surface is not equal to a width of the trench near the lower surface; at least an insulating layer located on a sidewall of the trench; at least a conducting pattern located on the insulating layer, wherein the side surface is separated from the conducting pattern in the trench by a predetermined distance such that a portion of the insulating layer is exposed; and at least a conducting region electrically connected to the conducting pattern.

An embodiment of the present invention provides a method for forming a chip package including: providing a wafer comprising a plurality of regions defined by a plurality of predetermined scribe lines; forming a plurality of through-holes penetrating through an upper surface and a lower surface of the wafer on locations overlapping the predetermined scribe lines, wherein a width of one of the trenches near the upper surface is not equal to a width of one of the trenches near the lower surface; forming an insulating layer on sidewalls of the through-holes; forming a conducting material layer on the insulating layer; patterning the conducting material layer into a plurality of isolated conducting patterns separated from each other, wherein the conducting patterns do not contact with the predetermined scribe lines; electrically connecting each of the conducting patterns to a corresponding conducting region; and dicing the wafer along the predetermined scribe lines to form a plurality of chip packages.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

A chip package according to an embodiment of the present invention may be applied to package a power MOSFET chip. According to another embodiment of the present invention, the chip package may be applied to package a light emitting chip. However, the applications thereof are not limited thereto. For example, in embodiments of the invention, the chip package may be applied to a variety of active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. Note that the above mentioned wafer scale package process may also be adapted to form chip packages of multi-layer integrated circuit devices by stacking together a plurality of wafers having integrated circuits.

Figure 5:
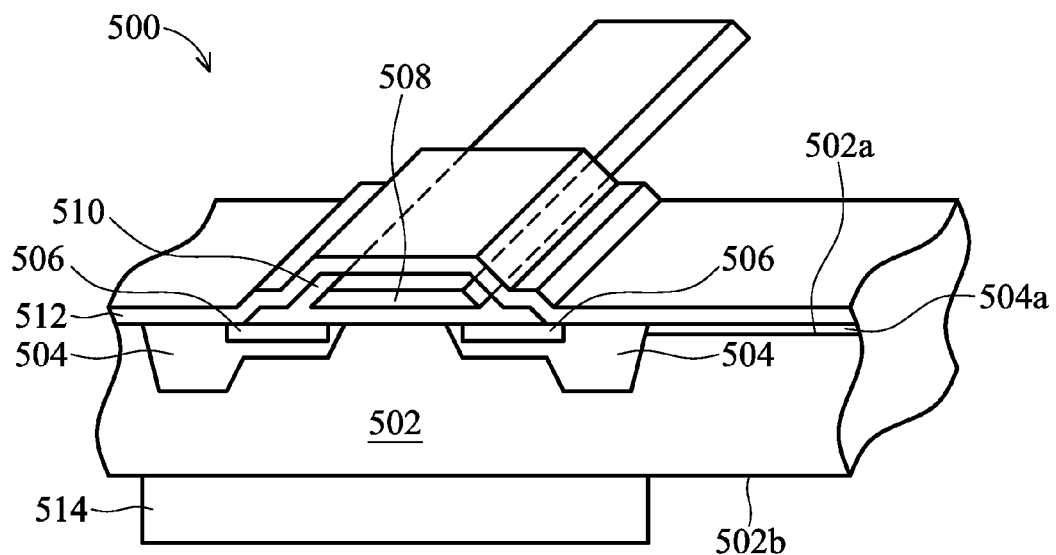
FIG. 5 is an illustrative three-dimensional view showing a power MOSFET chip package according to an embodiment of the present invention.

First, a power MOSFET chip package is taken as an example to illustrate a chip package having a sidewall electrode according to an embodiment of the present invention. Referring to FIG. 5, an illustrative three-dimensional view of a power MOSFET chip 500 is illustrated. The power MOSFET chip 500 includes a semiconductor substrate 502 and has a surface 502a and an opposite surface 502b. The conductivity type of the power MOSFET chip 500 may be n-type or p-type. Typically, the semiconductor substrate is usually n-type. Take an n-type semiconductor substrate 502 as an example, the semiconductor substrate may be a silicon substrate doped with an n-type dopant. The type or doping concentration of the dopant in the semiconductor substrate 502 may not be uniform. For example, the type or doping concentration of an n-type dopant doped in a lower portion of the semiconductor substrate 102 may be different from those of an n-type dopant doped in an upper portion of the semiconductor substrate 502. The semiconductor substrate 102 itself forms a drain region. Thus, the reference number 502 also represents the drain region of the power MOSFET chip 500.

The power MOSFET chip 500 includes a doped region 504 which extends downward from, for example, the surface 502a. The conductivity type of the doped region 504 is different from that of the semiconductor substrate 502. For example, when the semiconductor substrate 502 is an n-type substrate, the conductivity type of the doped region 504 is p-type, and vice versa.

The power MOSFET chip 500 includes a source region 506 located in the doped region 504. The conductivity types of the source region 506 and the semiconductor substrate 502 are the same, such as n-type. In this embodiment, the source region 506 extends downward from the surface 502a and is partially surrounded by the doped region 504 and thus located in the doped region 504.

The power MOSFET chip 500 includes a gate 508 which may be, for example, a polysilicon layer. A gate dielectric layer 510 is placed between the gate 508 and the semiconductor substrate 502. In addition, in another embodiment, the gate and the gate dielectric layer may be a buried structure formed in a recess of the substrate.

In the embodiment shown in FIG. 5, a source electrode layer 512 is formed overlying the semiconductor substrate 502. The source electrode layer 512 is electrically connected to the source region 506 and electrically insulated from the gate 508. An insulating layer 504a is placed between the semiconductor substrate 502 and the source electrode layer 512. The insulating layer 504a may be replaced by a doped region 504a, such as a p-type doped region, extending from the doped region 504. In another embodiment, the gate dielectric layer and the source insulating layer 504a may be simultaneously formed. The other exposed surface of the substrate may be used as a drain contact region. The source electrode layer 512 forms an ohmic contact with the source region 506. In addition, a drain electrode layer 514 may be formed underlying the semiconductor substrate (drain region) 502. The drain electrode layer 514 forms an ohmic contact with the drain region 502.

When a voltage is applied to the gate 508, a channel is formed in the doped region 504. By further applying an electrical field, an electron flow or a current may flow between the source electrode layer 512, the source region 506, the drain region 502, and the drain electrode layer 514.

Figure 1A:
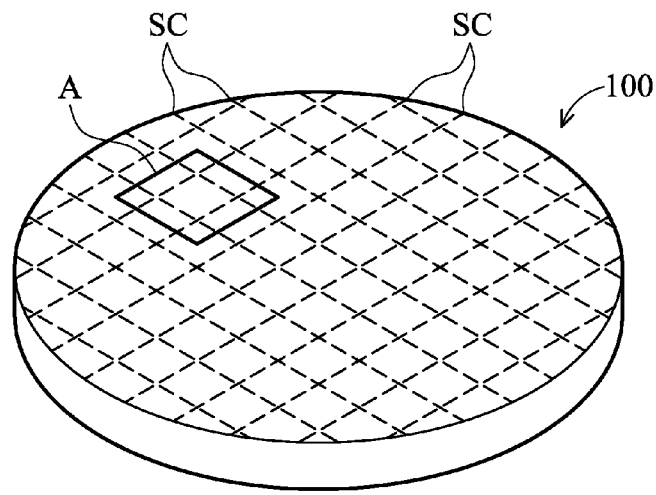
FIGS. 1A-1F are illustrative three-dimensional views showing the steps of forming a chip package according to an embodiment of the present invention.

FIGS. 1A-1F are illustrative three-dimensional views showing the steps of forming a chip package according to an embodiment. In this embodiment, the package process of a power MOSFET chip is illustrated as an example. As shown in FIG. 1A, a wafer 100 is provided, which has a plurality of power MOSFETs formed thereon. The wafer 100 has a plurality of predetermined scribe lines SC which define the wafer 100 into a plurality of regions, wherein one of the regions includes at least a power MOSFET. The power MOSFET may be formed by adopting conventional semiconductor manufacturing processes and the details thereof are not illustrated. The structure of the power MOSFET may be, for example, similar to, and is not limited to, the structure shown in FIG. 5.

Figure 1B:
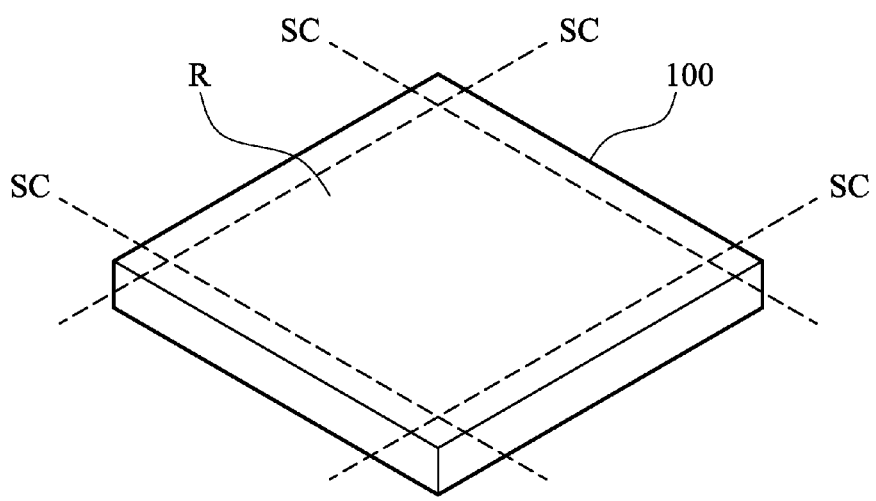

FIG. 1B is an enlarged three-dimensional view showing the region A in FIG. 1A, which is used to illustrate the following fabrication processes of the chip package according to the embodiment. It should be appreciated that the fabrication processes mentioned below are not limited to be performed to the region A. In this embodiment, similar or same fabrication processes are performed to a plurality of the regions of the wafer 100. After the wafer 100 is diced along the predetermined scribe lines SC in a following dicing process, a plurality of power MOSFET chip packages having sidewall contacts may be formed.

As shown in FIG. 1B, the scribe lines SC surround a region R in the region A. The region R has at least a power MOSFET. The structure of the power MOSFET may be similar to, and is not limited to, the structure shown in FIG. 5. The power MOSFET may include a semiconductor substrate having a first surface and an opposite second surface. The conductivity type of the semiconductor substrate may be a first conductivity type (such as n-type), and the semiconductor substrate forms a drain region. The power MOSFET further includes a doped region extending downward from the first surface. The conductivity type of the doped region is a second conductivity type (such as p-type). The power MOSFET further includes a source region located in the doped region. The conductivity type of the source region is the first conductivity type (such as n-type). The power MOSFET further includes a gate formed on the first surface or buried under the first surface and is separated from the semiconductor substrate by a gate dielectric layer. For simplicity, the drain region, the source region, and the gate are illustrated in FIG. 1B, and reference to the structure thereof may be made to, for example, FIG. 5.

Figure 1C:
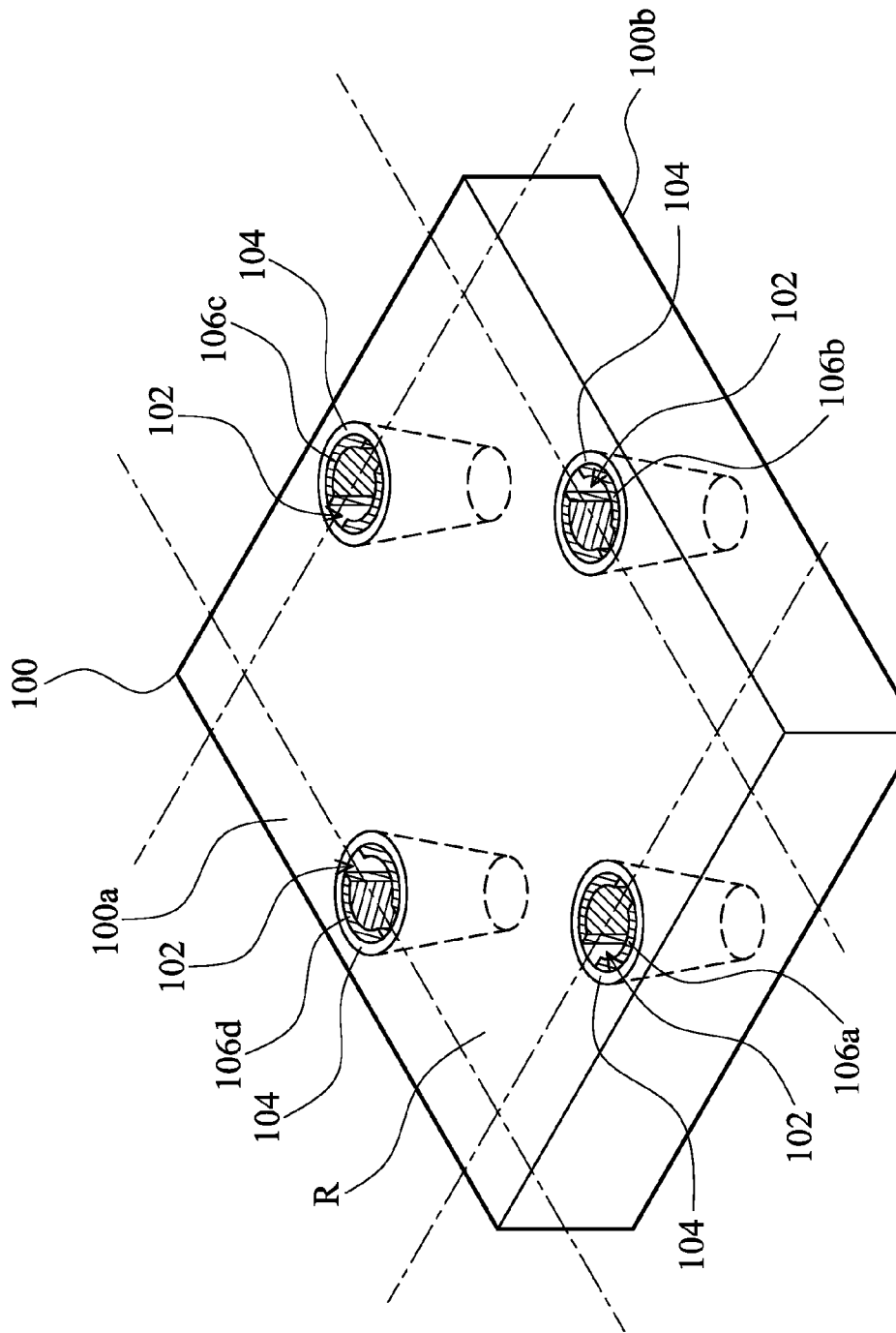

Next, as shown in FIG. 1C, a plurality of through-holes 102 penetrating the wafer 100 are formed in the wafer 100, and the locations of the through-holes 102 overlap a portion of the predetermined scribe lines SC. The method for forming the through-holes 102 may include, for example, a photolithography process and an etching process. Alternatively, in one embodiment, a hole extending from a surface towards an opposite surface of the wafer 100 may be first formed. The wafer 100 is then thinned from the opposite surface (by, for example, chemical mechanical polishing (CMP) or grinding) until the hole previously formed is exposed, to form the through-hole 102 penetrating the wafer 100. In the following process steps, a conducting layer is formed on sidewalls of the through-holes to form a plurality of through-substrate conducting structures. These through-substrate conducting structures will electrically contact with the gate, the source region, and the drain region, respectively, to serve as contacts of the power MOSFET. In addition, for facilitating the following patterning process, the sidewall of the through-hole 102 preferably inclines to the surface of the wafer 100. In other words, a width of the through-hole 102 near the upper surface 100a of the wafer 100 is not equal to a width of the through-hole 102 near the lower surface 100b of the wafer 100. In the embodiment shown in FIG. 1C, the upper width is larger than the lower width of the through-hole 102. In addition, the upper opening and the lower opening may have a variety of suitable shapes such as, and is not limited to, a circle, ellipse, or rectangle.

Still referring to FIG. 1C, an insulating layer 104 is formed on the sidewalls of the through-holes 102 to electrically insulate the subsequently formed conducting layers and the wafer 100. The insulating layer 104 may be, for example, an oxide layer and may be formed by CVD. However, the insulating layer 104 may be formed by other processes and/or materials.

Next, as shown in FIG. 1C, conducting patterns 106a, 106b, 106c, and 106d are formed on the insulating layer 104 in different through-holes 102. The conducting patterns electrically contact with the conducting regions on the wafer 100, respectively. For example, these conducting patterns may electrically contact with the gate, the source region, and the drain region, respectively. After the following dicing process, the conducting patterns may serve as sidewall contacts or sidewall electrodes of the power MOSFET chip. For example, the conducting pattern 106a may be electrically connected to the source region, the conducting pattern 106b may be electrically connected to the drain region, and the conducting pattern 106c may be electrically connected to the gate. In this embodiment, the conducting pattern 106d is electrically connected to the drain region. However, the formations of the conducting pattern 106d and the corresponding through-hole are not necessary. In one embodiment, only three through-holes and the conducting patterns therein need to be formed. However, it should be noted that because the power MOSFET chip package according to embodiments of the invention is preferably formed by using a wafer-level packaging process, the conducting pattern 106d may be used as a sidewall contact of another nearby power MOSFET chip although the conducting pattern 106d is not necessary for the power MOSFET chip to be formed in the region R. In addition, it should be noted that embodiments of the invention are not limited to power MOSFET chip packages. In another embodiment, the conducting pattern may be electrically connected to another conducting region. Further, the conducting region is not limited to be located on the wafer 100. In another embodiment, the conducting region which is electrically connected to the conducting pattern may be located on, for example, another chip which is disposed on the wafer.

In addition, as shown in FIG. 1C, all the conducting patterns in the through-holes merely cover a portion of the sidewall of the through-hole. These conducting patterns do not cover the predetermined scribe lines SC. Therefore, when the wafer 100 is subsequently diced to form a plurality of separate power MOSFET chips, portions diced by a dicing blade do not include these conducting patterns. Thus, the dicing blade does not directly contact with the conducting pattern and the dicing blade is prevented from being damaged. In addition, it is more important that the conducting patterns will not be pulled by the dicing blade during the dicing of the wafer, which may effectively prevent the conducting patterns from peeling.

The formation method for the conducting patterns in the through-holes will be illustrated with reference made to FIGS. 2A-2E which are top views showing the process steps. However, it should be noted that FIGS. 2A-2E merely illustrate an example of the formation method of the conducting patterns in the through-holes, therefore, the formation method is not limited thereto.

Figure 2A:
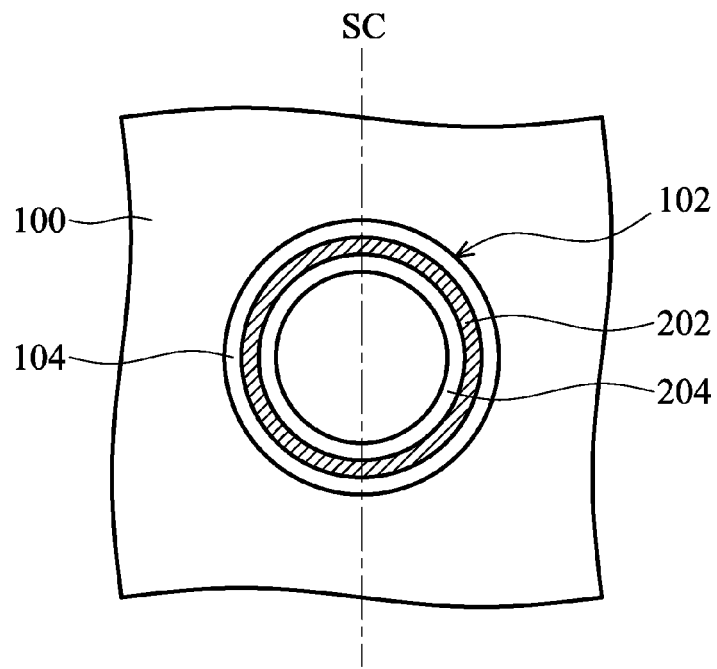
FIGS. 2A-2E are illustrative top views showing the steps of forming a patterned conducting layer in a through-hole according to an embodiment of the present invention.

As shown in FIG. 2A, the insulating layer 104 is first formed on the sidewall of the through-hole 102, and a seed layer 202 is then formed on the insulating layer 104. The seed layer 202 may be formed by, for example, physical vapor deposition, wherein the material of the seed layer is, for example, copper. In addition, it is preferable to form a diffusion barrier layer (not shown) between the seed layer 202 and the wafer 100, wherein the material of the diffusion barrier layer is, for example, TiW or TiCu which can prevent copper from diffusing into the wafer 100 and increase the adhesion between the seed layer 202 and the wafer 100 (or the insulating layer 104).

Next, as shown in FIG. 2A, a photoresist layer 204 is conformally formed on the seed layer 202. The photoresist layer 204 may be a photoresist which is capable of being electroplated such that the photoresist layer may be conformally formed on the seed layer 202 through an electroplating process (for example, the seed layer 202 is used as an electrode).

Figure 2B:
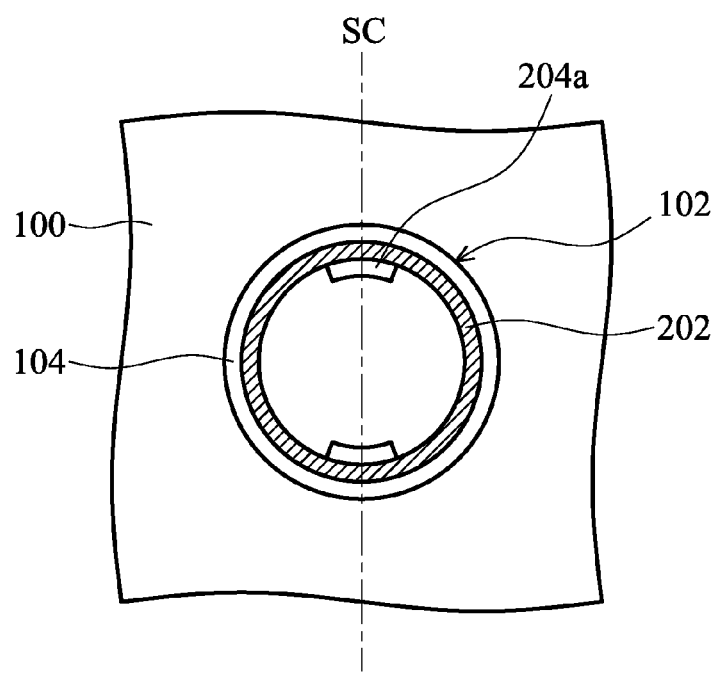

Next, as shown in FIG. 2B, the photoresist layer 204 is patterned to form a patterned photoresist layer 204a such as a patterned electroplated photoresist layer. The photoresist layer 204 on the regions near the predetermined scribe lines SC is left such that a portion of the seed layer 202 that does not contact with the predetermined scribe lines SC is exposed. In one embodiment, the electroplated photoresist layer is a negative photoresist. Thus, a shield may be used to cover two sides of the through-hole 102 such that the scribe line SC and a portion of the photoresist layer 204 penetrated by the scribe line SC are exposed. Then, the through-hole 102 is irradiated with a light such that the exposed photoresist layer 204 is hardened. Then, the photoresist that is not irradiated with the light is removed and the patterned photoresist layer 204a is formed.

Figure 3:
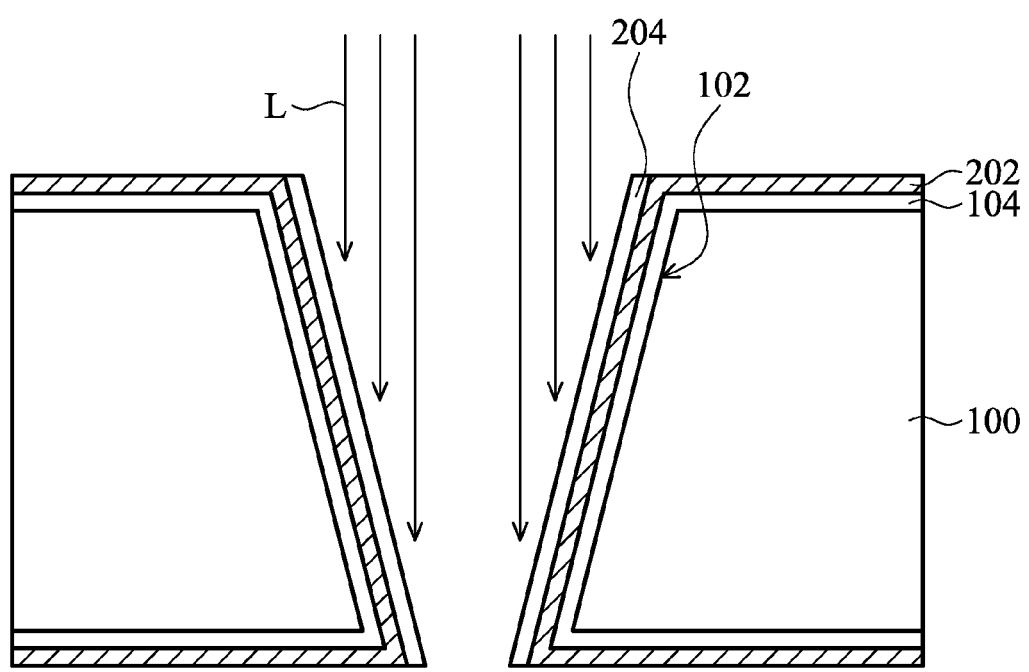
FIG. 3 is an illustrative top view showing the step of performing an exposure process to a photoresist layer in a through-hole according to an embodiment of the present invention.

Referring to FIG. 3, a cross-sectional view of the structure shown in FIG. 2A, taken along the predetermined scribe line SC, is illustrated, which is used to illustrate the exposure procedure of the photoresist layer 204. As shown in FIG. 3, because the sidewall of the through-hole 102 inclines with the surface of the wafer 100, the photoresist layer 204 near the scribe line SC may be adequately irradiated with a light and be hardened when the through-hole 102 is irradiated with the light L to harden the exposed photoresist layer 204.

Figure 2C:
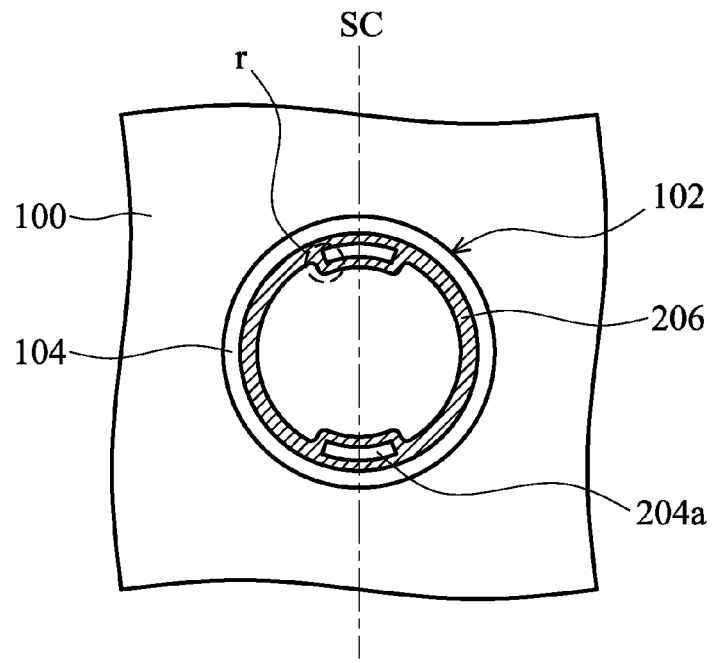

Next, referring to FIGS. 2B and 2C, an electroplated conducting layer 206 is formed on the exposed seed layer 202. For example, an electroplating process may be performed to form the electroplated conducting layer 206. Because the patterned photoresist layer 204a is typically a negative electroplated photoresist, the electroplated conducting layer 206 may also be formed on the patterned photoresist layer 204a when the electroplated conducting layer 206 is formed on the seed layer 202.

Figure 2D:
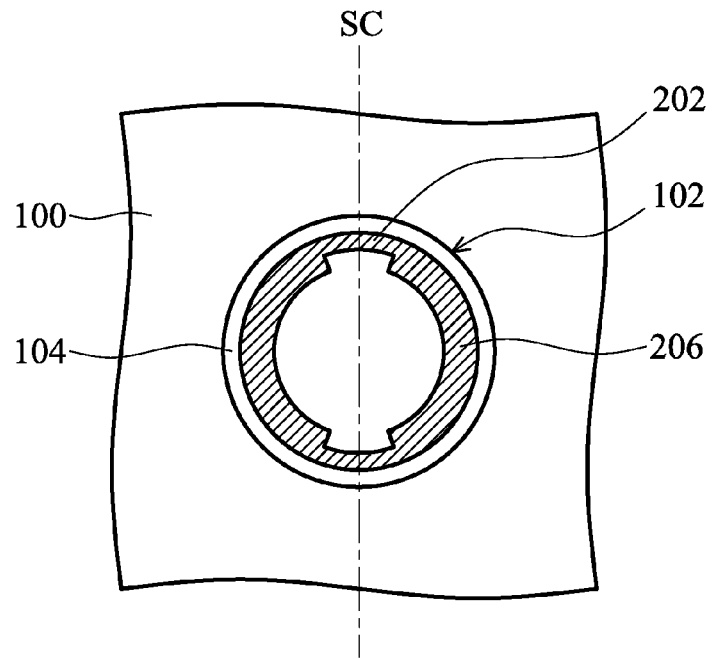

Next, as shown in FIG. 2D, the patterned photoresist layer 204a is removed such that the seed layer 202 thereunder is exposed. In one embodiment, when the patterned photoresist layer 204a is removed, a portion of the electroplated conducting layer 206 directly on the patterned photoresist layer 204a is also simultaneously removed. This is because that the connection between the portion of the electroplated conducting layer 206 directly on the patterned photoresist layer 204a and the other portion of the electroplated conducting layer 206 formed on the seed layer 202 nearby is weaker, as shown in region r in FIG. 2C. Thus, when the patterned photoresist layer 204a is removed, the portion of the electroplated conducting layer 206 directly on the patterned photoresist layer may easily peel, as shown in FIG. 2D.

Figure 2E:
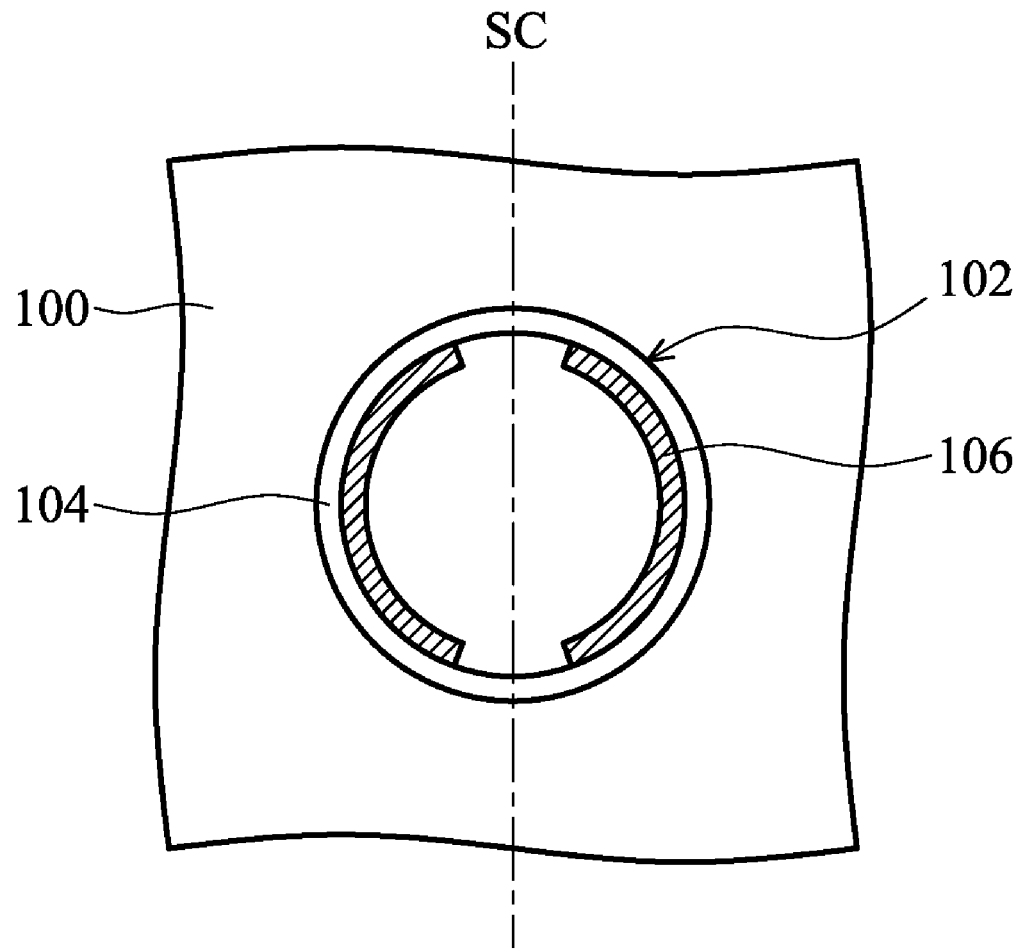

Next, as shown in FIG. 2E, the seed layer 202, which is exposed after the patterned photoresist layer 204a is removed, may be removed through an etching process such that a conducting pattern 106 as shown in FIG. 2E is formed. All the conducting patterns 106a, 106b, 106c, and 106d may be formed by the above mentioned method used to form the conducting pattern 106. In addition, in one embodiment, when the exposed seed layer 202 is being removed, a portion of the electroplated conducting layer 206 is simultaneously removed such that the thickness thereof is reduced.

In one embodiment, a variety of wire layouts may be formed on the wafer 100 (for example, a redistribution layer is formed) such that the conducting patterns may be electrically connected to the gate, the source region, or the drain region of the power MOSFET, respectively.

Figure 1D:
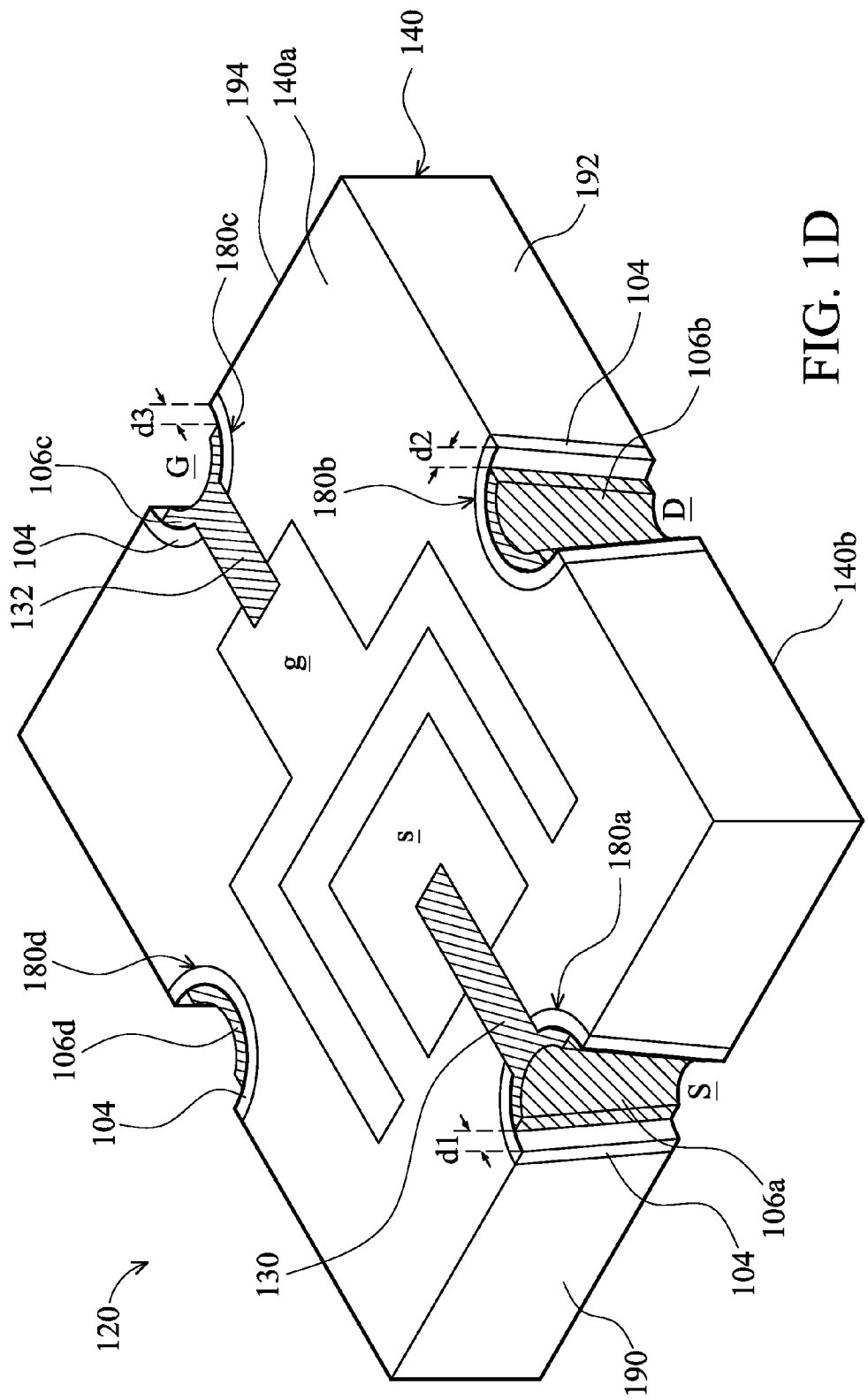

Referring back to FIG. 1C, after the conducting patterns (106a-d) are formed in the through-holes 102, the wafer 100 is diced along the predetermined scribe lines SC to form a plurality of separate power MOSFET chip packages. Because the conducting layer which is originally formed on the predetermined scribe lines has been removed after the patterning process, the conducting patterns are not cut during the dicing process. The dicing blade is prevented from being damaged, and the peeling of the conducting patterns due to the pulling of the dicing blade is effectively prevented, increasing the reliability and yield of devices. FIG. 1D is an illustrative three-dimensional view showing one of the power MOSFET chip package 120.

As shown in FIG. 1D, the power MOSFET chip package 120 includes a semiconductor substrate 140. Redistribution layers may be formed on the semiconductor substrate 140. For example, a redistribution layer 130 is used to provide an electrical connection between the conducting pattern 106a and the previously formed source region s in the semiconductor substrate 140. The redistribution layer 132 is used to provide an electrical connection between the conducting pattern 106c and the previously formed gate g in the semiconductor substrate 140. Similarly, a redistribution layer may also be formed overlying the semiconductor substrate 140 (such as formed on the bottom surface of the semiconductor substrate 140, not shown), which is used to provide an electrical connection between the conducting patterns 106b and/or 106d and the previously formed drain region (such as formed on the bottom surface of the semiconductor substrate 140, not shown) in the semiconductor substrate 140. Therefore, in this embodiment, the conducting patterns 106a, 106b (and/or 106d), and 106c located on the side surfaces of the power MOSFET chip package 120 may serve as a source contact S, a drain contact D, and a gate contact G, respectively. These contacts located on the sidewalls may be used to be integrated with other electronic elements, such as a printed circuit board.

In the embodiment shown in FIG. 1D, the power MOSFET chip package 120 includes the semiconductor substrate 140 having an upper surface 140a and a lower surface 140b. The semiconductor substrate 140 has a first conductivity type, such as an n-type. The semiconductor substrate 140 includes a drain region (not shown in this figure, so see FIG. 5). The power MOSFET chip package 120 includes a doped region (not shown in this figure, so see FIG. 5) located in the semiconductor substrate 140. The doped region has a second conductivity type, such as a p-type. The power MOSFET chip package 120 includes the source region s located in the doped region. The source region has the first conductivity type. The power MOSFET chip package 120 includes the gate g formed overlying the surface 140a or buried under the surface 140a. A gate dielectric layer is located between the gate and the semiconductor substrate 140 (not shown in this figure, so see FIG. 5).

In addition, as shown in FIG. 1D, the power MOSFET chip package 120 further includes a trench 180a extending from a side surface 190 of the semiconductor substrate 140 towards an inner portion of the semiconductor substrate 140 and extending from the upper surface 140a towards the lower surface 140b. In addition, a width of the trench 180a near the upper surface 140a is not equal to a width of the trench 180a near the lower surface 140b. For example, in the embodiment shown in FIG. 1D, the upper width is larger than the lower width of the trench 180a. The conducting pattern 106a is formed overlying a sidewall of the trench 180a, wherein the conducting pattern 106a is not coplanar with the side surface 190 and separated from the side surface 190 by a predetermined distance d1, and the conducting pattern 106a is electrically connected to the source region s. In other words, the side surface 190 is separated from the conducting pattern 106a in the trench 180a by the predetermined distance d1 such that a portion of the insulating layer 104 is exposed.

As shown in FIG. 1D, the power MOSFET chip package 120 further includes a trench 180b extending from a side surface 192 of the semiconductor substrate 140 towards the inner portion of the semiconductor substrate 140 and extending from the upper surface 140a towards the lower surface 140b. In addition, a width of the trench 180b near the upper surface 140a is not equal to a width of the trench 180b near the lower surface 140b. For example, in the embodiment shown in FIG. 1D, the upper width is larger than the lower width of the trench 180b. The conducting pattern 106b is formed overlying a sidewall of the trench 180b, wherein the conducting pattern 106b is not coplanar with the side surface 192 and separated from the side surface 192 by a predetermined distance d2, and the conducting pattern 106b is electrically connected to the drain region (not shown in this figure, so see FIG. 5). In other words, the side surface 192 is separated from the conducting pattern 106b in the trench 180b by the predetermined distance d2 such that a portion of the insulating layer 104 is exposed.

As shown in FIG. 1D, the power MOSFET chip package 120 further includes a trench 180c extending from a side surface 194 of the semiconductor substrate 140 towards an inner portion of the semiconductor substrate 140 and extending from the upper surface 140a towards the lower surface 140b. In addition, a width of the trench 180c near the upper surface 140a is not equal to a width of the trench 180c near the lower surface 140b. For example, in the embodiment shown in FIG. 1D, the upper width is larger than the lower width of the trench 180c. The conducting pattern 106c is formed overlying a sidewall of the trench 180c, wherein the conducting pattern 106c is not coplanar with the side surface 194 and separated from the side surface 194 by a predetermined distance d3, and the conducting pattern 106c is electrically connected to the gate g. In other words, the side surface 194 is separated from the conducting pattern 106c in the trench 180c by the predetermined distance d3 such that a portion of the insulating layer 104 is exposed.

As shown in FIG. 1D, the power MOSFET chip package 120 further includes a trench 180d extending from a side surface of the semiconductor substrate 140 towards an inner portion of the semiconductor substrate 140 and extending from the upper surface 140a towards the lower surface 140b. In addition, a width of the trench 180d near the upper surface 140a is not equal to a width of the trench 180d near the lower surface 140b. The conducting pattern 106d is formed overlying a sidewall of the trench 180d, wherein the conducting pattern 106d is not coplanar with the side surface and separated from the side surface by a predetermined distance. In other words, the side surface is separated from the conducting pattern 106d in the trench 180d by the predetermined distance such that a portion of the insulating layer 104 is exposed.

Figure 1E:
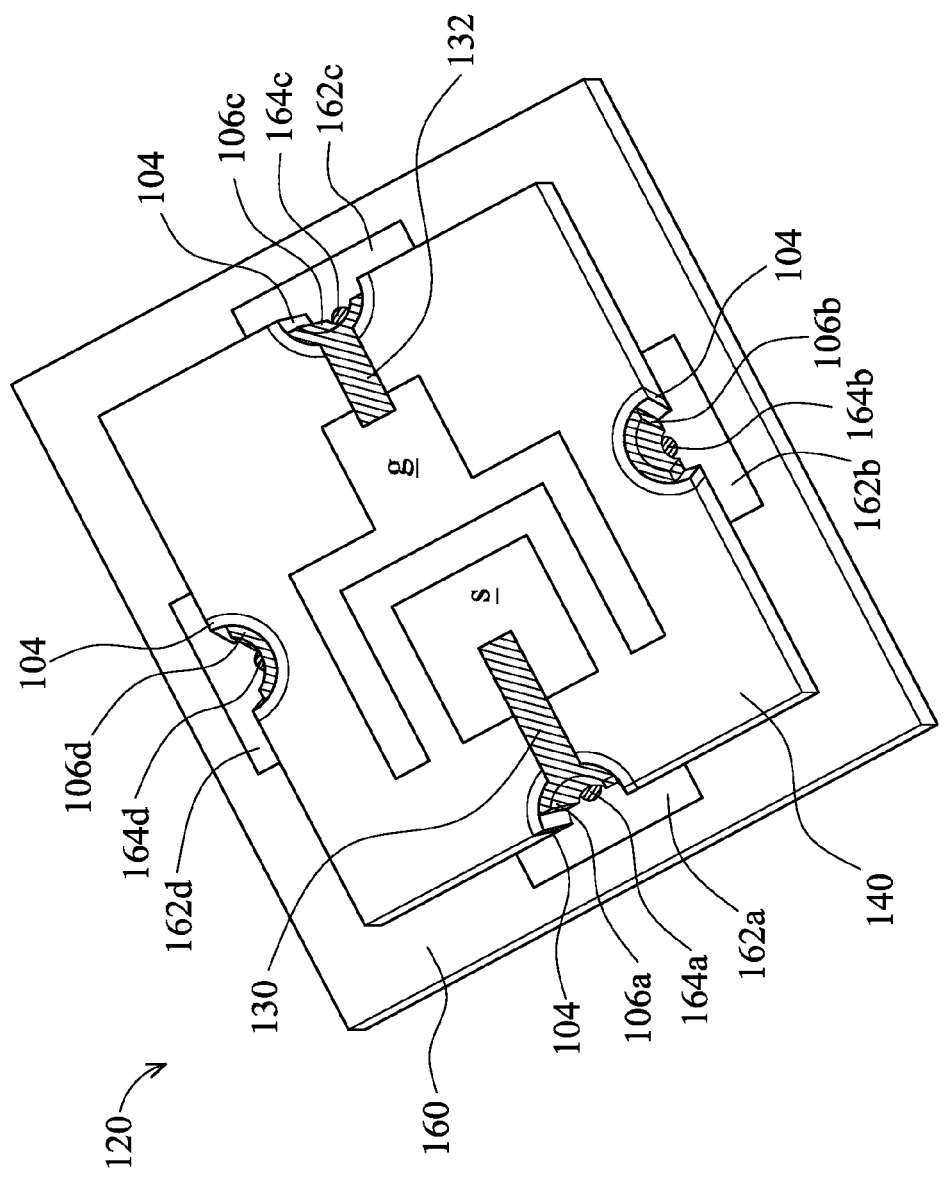

As shown in FIG. 1E, the power MOSFET chip package 120 may be disposed overlying a printed circuit board 160.

Figure 1F:
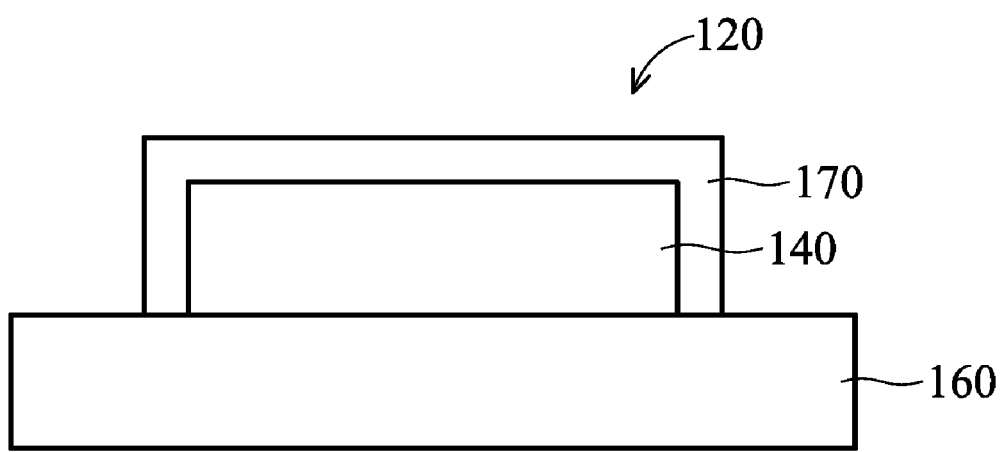

The printed circuit board 160 may include contact pads 162a, 162b, 162c, and 162d formed thereon. Then, conducting structures 164a, 164b (and/or 164d), and 164c are formed on interfaces between the conducting patterns 106a, 106b (and/or 106d), and 106c and the contact pads 162a, 162b (and/or 162d), and 162c, respectively. The conducting structures 164a, 164b (and/or 164d), and 164c may include solder material having electrical conductivity, which not only adheres and fixes to the patterned conducting layers and the contact pads, but also forms electrical connections therebetween. Because the conducting structures 164a, 164b (and/or 164d), and 164c are formed on the sidewalls of the semiconductor substrate 140, it is easier to observe whether the soldering process or the deposition of conductors is successful. The process parameters may thus be adjusted accordingly and timely, further improving process yield. Then, as shown in FIG. 1F, a passivation layer 170 may be formed overlying the power MOSFET chip package 120.

Figure 4A:
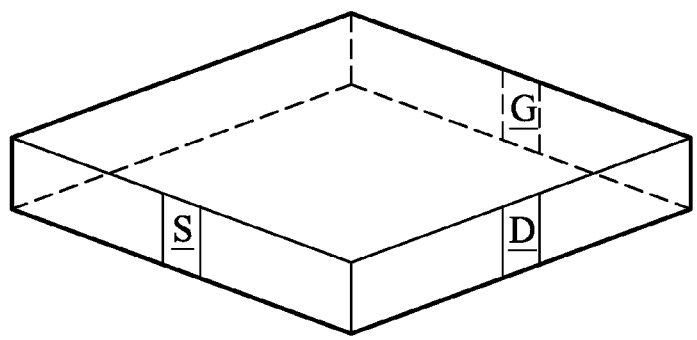
FIGS. 4A-4G are illustrative three-dimensional views showing power MOSFET chip packages having sidewall contacts according to embodiments of the present invention.
Figure 4B:
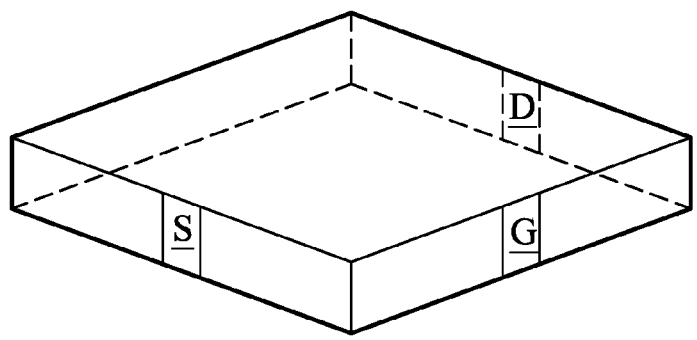
Figure 4C:
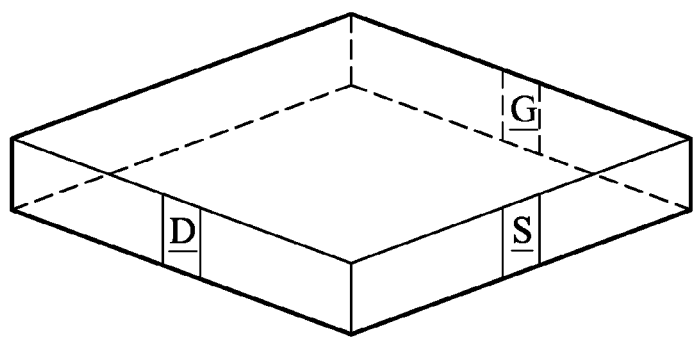
Figure 4D:
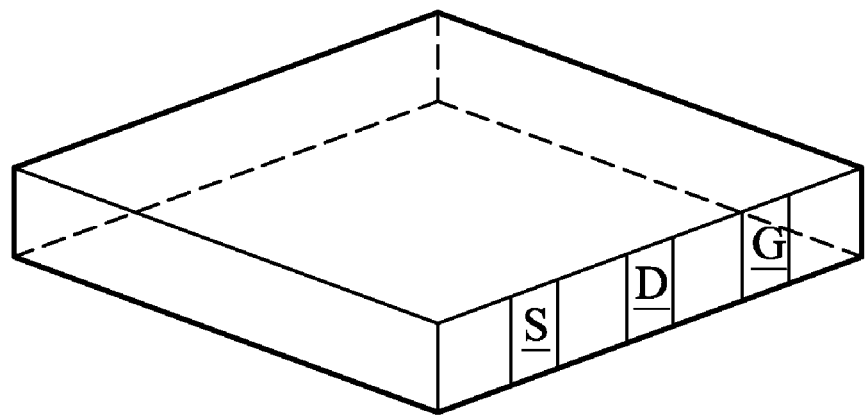
Figure 4E:
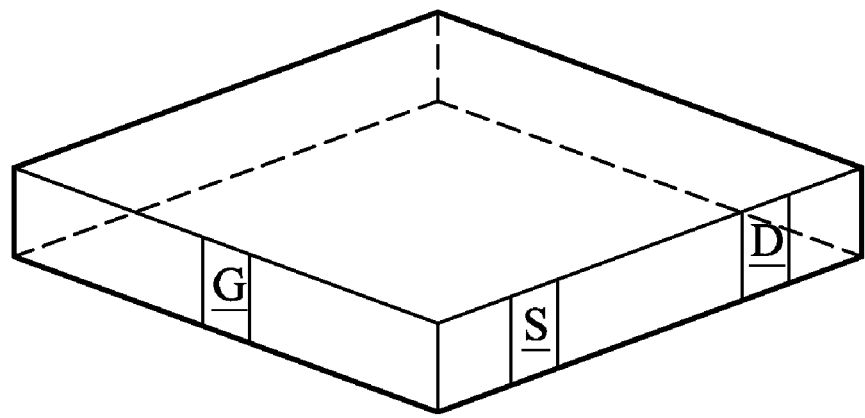
Figure 4F:
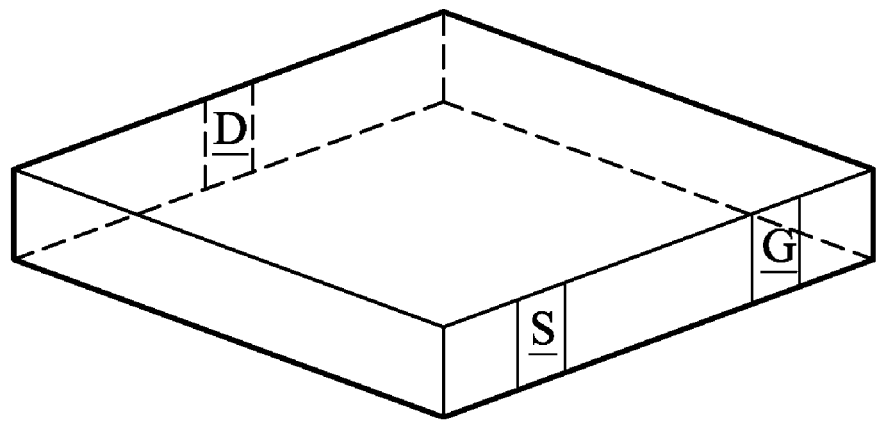
Figure 4G:
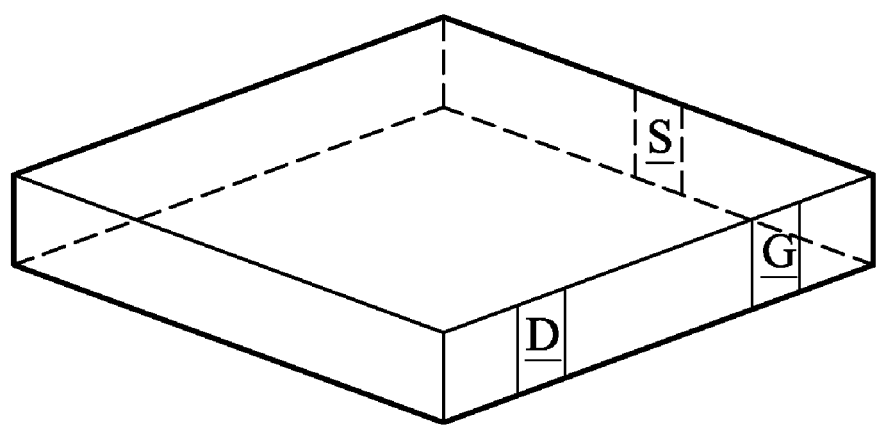

Note that the power MOSFET chip package having sidewall contacts according to an embodiment of the present invention is not limited to the embodiments mentioned above. For example, in one embodiment, a plurality of through-holes (such as two or three) may be formed on the same scribe line. Thus, after the wafer is diced, corresponding with redistribution layers, a plurality of sidewall contacts may be formed on a same side surface. FIGS. 4A-4G illustrate three-dimensional views of power MOSFET chip packages having sidewall contacts according to embodiments of the present invention, wherein, the source sidewall contact S (i.e., the conducting patterns 106a), the drain sidewall contact D (i.e., the conducting pattern 106b), and the gate sidewall contact G (i.e., the conducting pattern 106c) may be respectively located on different side surfaces of the semiconductor substrate and have a variety of relationships, as shown in FIGS. 4A-4C. In addition, in the embodiments shown in FIGS. 4D-4G, the same side surface of the semiconductor substrate may include a plurality of sidewall contacts formed thereon. For example, the side surface of the semiconductor substrate may include a source sidewall contact S, a drain sidewall contact D, and a gate sidewall contact G formed thereon. Alternatively, the side surface of the semiconductor substrate may include a source sidewall contact S and a drain sidewall contact D or a gate sidewall contact G formed thereon. Alternatively, the side surface of the semiconductor substrate may include a drain sidewall contact D and a gate sidewall contact G formed thereon.

In the embodiments mentioned above, the sidewall electrodes are formed in the body of the chip, such as on the side surface of the power MOSFET chip. However, embodiments of the present invention are not limited thereto. In another embodiment, the sidewall electrode is formed in a carrier substrate, and the chip is disposed on the carrier substrate and is electrically connected to the sidewall electrode on the side surface of the carrier substrate through, for example, a redistribution layer.

Figure 6:
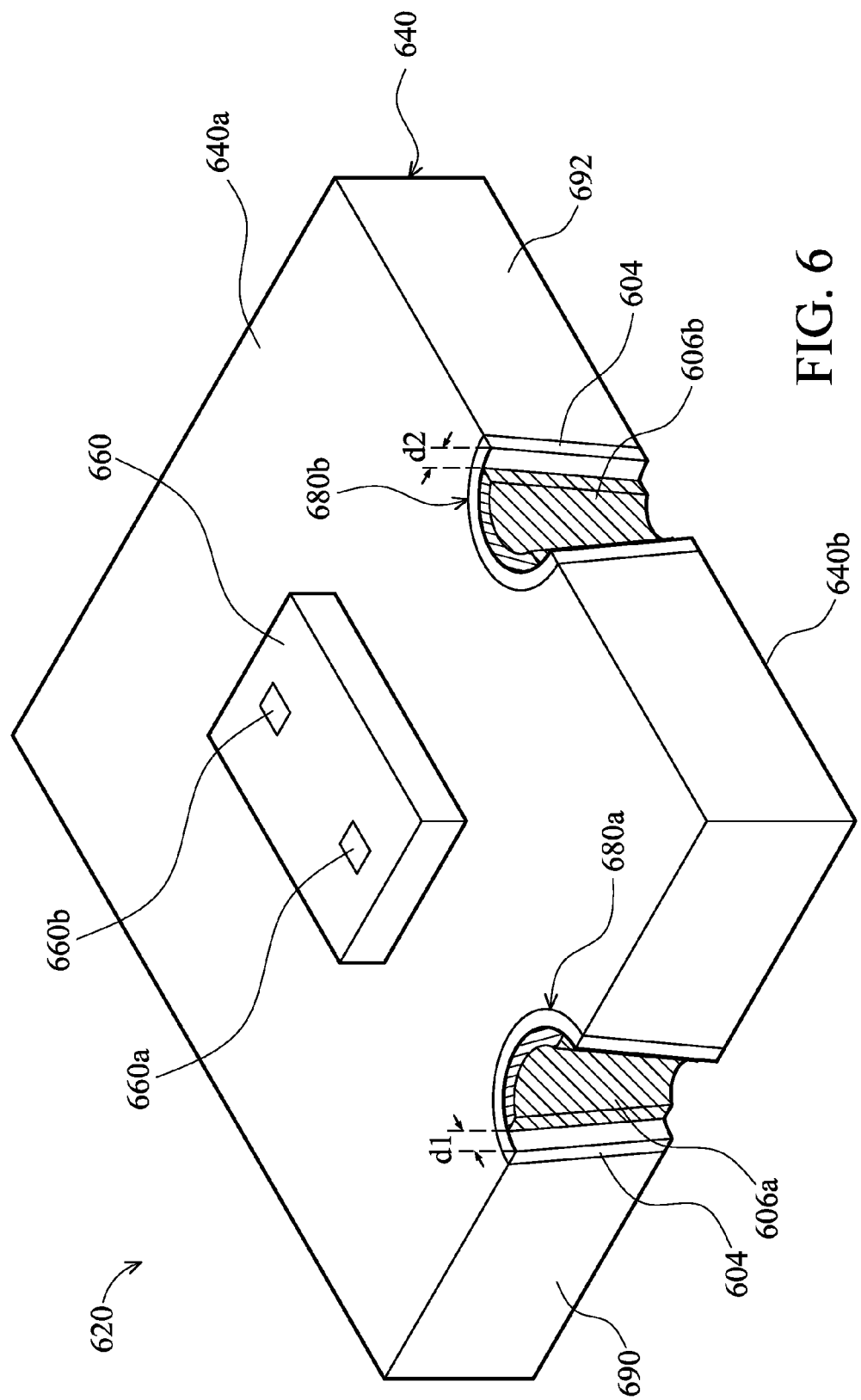
FIG. 6 is an illustrative three-dimensional view showing a chip package according to an embodiment of the present invention.

FIG. 6 is an illustrative three-dimensional view showing the steps of forming a chip package 620 according to an embodiment. As shown in FIG. 6, a carrier wafer may be diced into a plurality of carrier substrate 640 by a method similar to that illustrated in FIGS. 1A-1D. The material of the carrier substrate 640 may include a semiconductor material or a ceramic material. The carrier substrate 640 has an upper surface 640a and a lower surface 640b and has at least a side surface including such as side surfaces 690 and 692. The chip package 620 further includes at least a trench (including, for example, trenches 680a and 680b) which extends from the upper surface 640a towards the lower surface 640b and extends from the side surface towards an inner portion of the substrate 640. For example, the trench 680a extends from the side surface 690 towards the inner portion of the substrate 640, and the trench 680b extends from the side surface 692 towards the inner portion of the substrate 640. A width of the trench 680a or 680b near the upper surface 640a is not equal to a width of the trench 680a or 680b near the lower surface 640b. The chip package 620 further includes at least an insulating layer 604 located on the sidewall of the trench. The chip package 620 further includes at least a conducting pattern (such as conducting patterns 606a and 606b) located on the insulating layer 604. In addition, the side surface is separated from the conducting pattern in the trench by a predetermined distance (such as a distance d1 or d2) such that a portion of the insulating layer 604 is exposed. That is, the conducting pattern on the sidewall of the trench retreats from the side surface. Thus, the conducting pattern will not be pulled during the dicing of the carrier wafer, ensuring the quality of the sidewall electrode.

As shown in FIG. 6, at least a chip 660 may be disposed on the carrier substrate 640, which is, for example, (but is not limited to) a light emitting chip. The chip 660 may have at least a conducting region such as conducting regions 660a and 660b. Take a light emitting diode chip as an example, the conducting regions 660a and 660b may be, for example, a p-electrode and an n-electrode of the light emitting chip, respectively. In one embodiment, the conducting regions 660a and 660b may be electrically connected to the conducting patterns 606a and 606b through redistribution layers or bonding wires (not shown), respectively. In addition, similarly, the chip package 620 may also be further disposed on a printed circuit board and electrically connected to contact pads on the printed circuit board through the sidewall electrodes formed on the chip package 620.

In embodiments of the invention, because through-holes having inclined sidewall are formed, the formation step of the sidewall electrodes may be smooth, ensuring the conducting patterns in the through-holes from not being pulled and peeling during the wafer dicing process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having an upper surface and a lower surface and having at least a side surface;
   at least a trench extending from the upper surface towards the lower surface and extending from the side surface towards an inner portion of the substrate, wherein a width of the trench near the upper surface is not equal to a width of the trench near the lower surface;
   at least an insulating layer located on a sidewall of the trench;
   at least a conducting pattern located on the insulating layer, wherein the side surface is separated from the conducting pattern in the trench by a predetermined distance such that a portion of the insulating layer is exposed; and
   at least a conducting region electrically connected to the conducting pattern.

2. The chip package as claimed in claim 1, further comprising:

at least a second trench extending from the upper surface towards the lower surface and extending from a second side surface of the substrate towards the inner portion of the substrate, wherein a width of the second trench near the upper surface is not equal to a width of the second trench near the lower surface;

at least a second insulating layer located on a sidewall of the second trench;

at least a second conducting pattern located on the second insulating layer, wherein the second side surface is separated from the second conducting pattern in the second trench by a second predetermined distance such that a portion of the second insulating layer is exposed; and at least a second conducting region electrically connected to the second conducting pattern.

3. The chip package as claimed in claim 2, further comprising a chip disposed on the substrate, wherein the conducting region and the second conducting region are located on the chip.

4. The chip package as claimed in claim 3, wherein the chip comprises a light emitting chip.

5. The chip package as claimed in claim 2, further comprising:

at least a third trench extending from the upper surface towards the lower surface and extending from a third side surface of the substrate towards the inner portion of the substrate, wherein a width of the third trench near the upper surface is not equal to a width of the third trench near the lower surface;

at least a third insulating layer located on a sidewall of the third trench;

at least a third conducting pattern located on the third insulating layer, wherein the third side surface is separated from the third conducting pattern in the third trench by a third predetermined distance such that a portion of the third insulating layer is exposed; and at least a third conducting region electrically connected to the third conducting pattern.

6. The chip package as claimed in claim 5, wherein the substrate comprises a semiconductor substrate.

7. The chip package as claimed in claim 6, further comprising:

a drain region located in the semiconductor substrate, wherein a conductivity type of the drain region is a first conductivity type;

a doped region located in the semiconductor substrate, wherein a conductivity type of the doped region is a second conductivity type;

a source region located in the doped region, wherein a conductivity type of the source region is the first conductivity type; and a gate located on the semiconductor substrate or buried in the semiconductor substrate, wherein the gate is separated from the semiconductor substrate by a gate dielectric layer, and wherein:

the drain region comprises the conducting region;

the source region comprises the second conducting region; and the gate comprises the third conducting region.

8. The chip package as claimed in claim 7, wherein at least two of the side surface, the second side surface, and the third side surface are different side surfaces or a same side surface.

9. The chip package as claimed in claim 2, wherein the side surface and the second side surface are different side surfaces or a same side surface.

10. The chip package as claimed in claim 1, further comprising a printed circuit board having at least a pad, wherein the substrate is disposed on the printed circuit board, and the conducting pattern is electrically connected to the pad.

* * * * *